(12) United States Patent
Chuang

(10) Patent No.: US 9,727,093 B2
(45) Date of Patent: Aug. 8, 2017

(54) BIAXIAL SYNCHRONIZATION DUAL-SHAFT HINGE

(71) Applicant: DEDA METAL CO., LTD., New Taipei (TW)

(72) Inventor: Kun-You Chuang, New Taipei (TW)

(73) Assignee: DEDA METAL CO., LTD., New Taipei (TW)

( * ) Notice: Subject to any disclaimer, the term of this patent is extended or adjusted under 35 U.S.C. 154(b) by 0 days.

(21) Appl. No.: 15/344,576

(22) Filed: Nov. 6, 2016

(65) Prior Publication Data
US 2017/0131743 A1 May 11, 2017

(30) Foreign Application Priority Data

Nov. 10, 2015 (TW) .............................. 104217951 U

(51) Int. Cl.
*G06F 1/16* (2006.01)
*E05D 3/06* (2006.01)
*E05D 11/08* (2006.01)

(52) U.S. Cl.
CPC ............. *G06F 1/1681* (2013.01); *E05D 3/06* (2013.01); *E05D 11/082* (2013.01); *E05Y 2900/606* (2013.01); *Y10T 16/547* (2015.01)

(58) Field of Classification Search
CPC .... G06F 1/1681; G06F 1/1618; G06F 1/1616; E05D 3/06; E05D 3/12; E05D 11/082; E05D 2011/085; E05D 2005/106; E05Y 2900/606; H04M 1/022; H05K 5/0226; Y10T 16/5403; Y10T 16/540345; Y10T 16/54038; Y10T 16/547; Y10T 16/5387; Y10T 16/540255

USPC ................ 16/366, 342, 337, 340, 303, 330; 361/679.06, 679.27; 379/433.13; 455/575.3
See application file for complete search history.

(56) References Cited

U.S. PATENT DOCUMENTS

| | | | | |
|---|---|---|---|---|
| 8,776,319 B1 * | 7/2014 | Chang | .................... | G06F 1/1681 16/303 |
| 8,904,601 B2 * | 12/2014 | Hsu | ...................... | H04M 1/0216 16/366 |
| 8,914,946 B2 * | 12/2014 | Hsu | .......................... | F16H 21/44 16/342 |
| 8,959,716 B2 * | 2/2015 | Hsu | ........................... | E05D 3/06 16/302 |
| 8,959,720 B2 * | 2/2015 | Hsu | ....................... | G06F 1/1681 16/303 |
| 9,003,606 B2 * | 4/2015 | Hsu | ....................... | G06F 1/1681 16/366 |
| 9,021,658 B1 * | 5/2015 | Yang | ..................... | G06F 1/1681 16/366 |

(Continued)

*Primary Examiner* — William Miller

(57) ABSTRACT

A biaxial synchronization dual-shaft hinge includes a transmission device set consisting of a first transmission member, a second transmission member, a first interlocking member and a second interlocking member, and pivot shaft set consisting of a first pivot shaft and a second pivot shaft. The arrangement of the transmission device set enables the first pivot shaft and second pivot shaft of the pivot shaft set to be biased synchronously in reversed directions so that the top cover member and bottom base member of the dual-leaf mobile electronic device that are respectively affixed to the first pivot shaft and second pivot shaft of the pivot shaft set can be opened and closed smoothly and stably.

3 Claims, 11 Drawing Sheets

(56) References Cited

U.S. PATENT DOCUMENTS

2015/0189777 A1* 7/2015 Hsu .................. H05K 5/0226
                                                        16/366
2015/0342068 A1* 11/2015 Su .................... G06F 1/1681
                                                        16/354

* cited by examiner

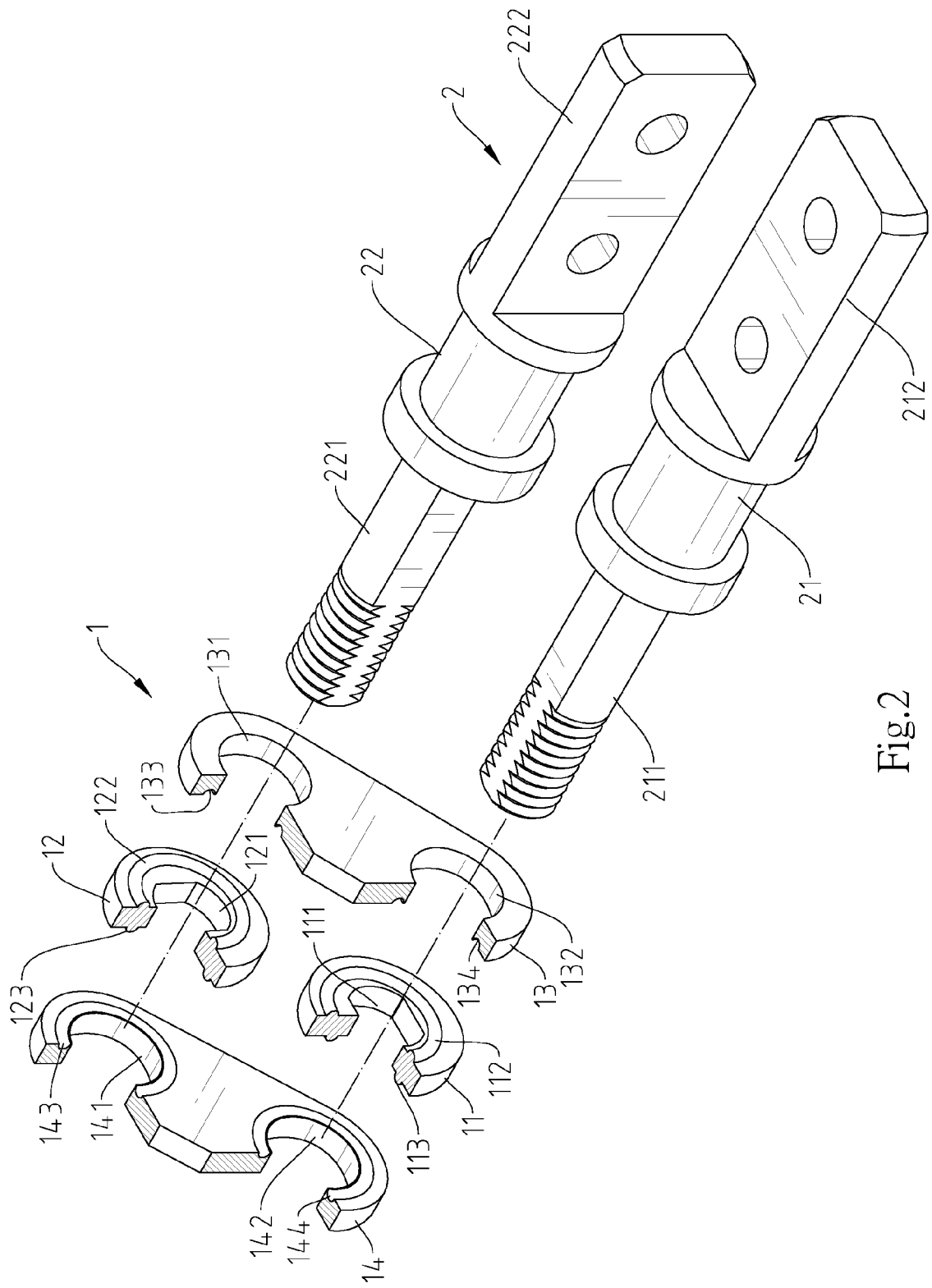

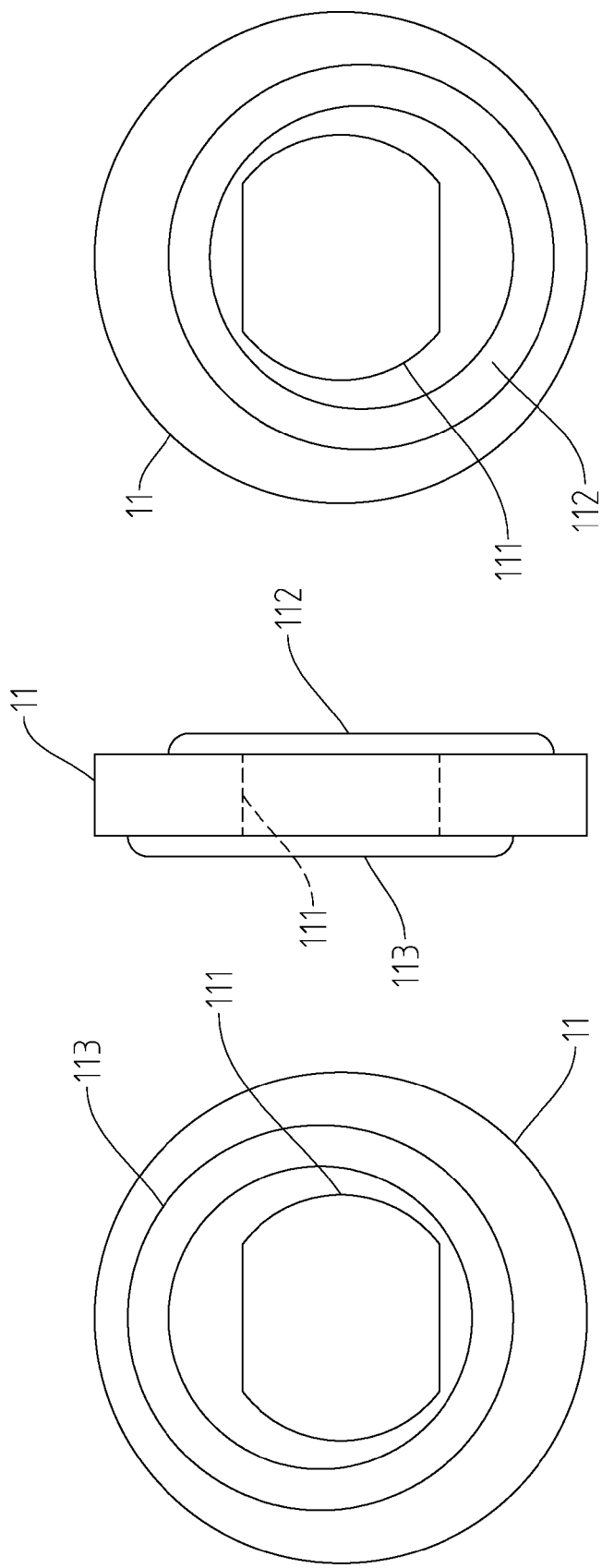

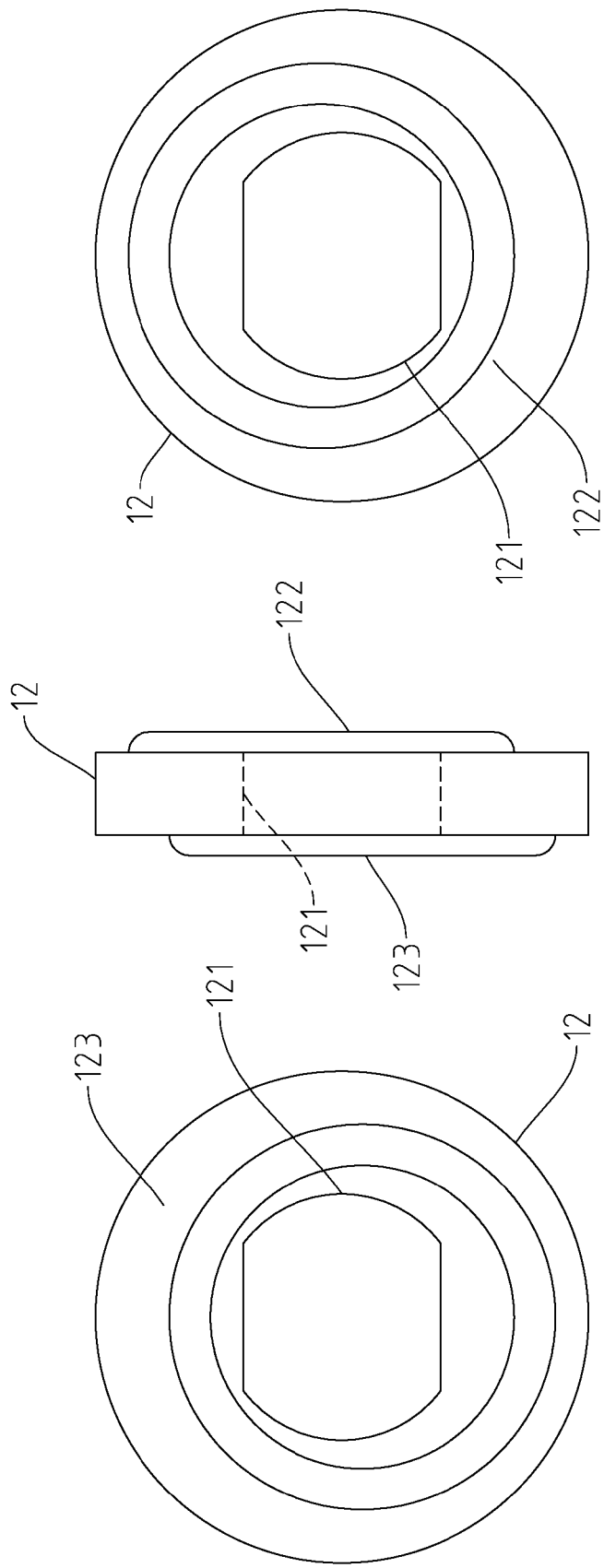

BIAXIAL SYNCHRONIZATION DUAL-SHAFT HINGE

BACKGROUND OF THE INVENTION

1. Field of the Invention

The present invention relates to hinge technology and more particularly, to a biaxial synchronization dual-shaft hinge, which uses a transmission device set for enabling a first pivot shaft and a second pivot shaft of a pivot shaft set to be rotated synchronously and stably in reversed directions so that the top cover member and bottom base member of the dual-leaf mobile electronic device using the biaxial synchronization dual-shaft hinge can be accurately and smoothly opened and closed.

2. Description of the Related Art

Various dual-shaft hinges are known and widely used in notebook computers, smart phones and many other dual-leaf mobile electronic devices to connect a display screen-incorporated top cover member and a bottom base member of a dual-leaf mobile electronic device together, allowing the top cover member and the bottom base member to be closed and opened. These dual-shaft hinges will generate a friction force during rotation of the respective male pivot shaft members relative to the respective female when the user bias the display screen-incorporated top cover member of the dual-leaf mobile electronic device relative to the bottom base member, enabling the top cover member to be positioned at the desired angle.

However, after a long use, the friction force will be reduced and the rotation sequence of the male pivot shaft components can not be ensured, affecting the positioning accuracy and biasing stability of the display screen-incorporated top cover member of the dual-leaf mobile electronic device.

SUMMARY OF THE INVENTION

The present invention has been accomplished under the circumstances in view. It is therefore the main object of the present invention to provide a biaxial synchronization dual-shaft hinge, which uses a transmission device set for enabling a first pivot shaft and a second pivot shaft of a pivot shaft set to be rotated synchronously and stably in reversed directions so that the top cover member and bottom base member of the dual-leaf mobile electronic device using the biaxial synchronization dual-shaft hinge can be accurately and smoothly opened and closed.

To achieve this and other objects of the present invention, a biaxial synchronization dual-shaft hinge comprises a transmission device set and a pivot shaft set. The transmission device set comprises a first transmission member, a second transmission member and a first interlocking member. The first interlocking member comprises a first through hole and a second through hole provided through opposing front and back walls thereof, a first annular groove located on the front wall and concentrically disposed around the first through hole, and a second annular groove located on the front wall and concentrically disposed around the second through hole. The first transmission member comprises a first mounting hole provided through opposing front and back walls thereof, a first annular rib located on the back wall and disposed around the first mounting hole in a non-concentric manner and positioned in the second annular groove of the first interlocking member. The second transmission member comprises a second mounting hole provided through opposing front and back walls thereof, a third annular rib located on the back wall and disposed around the second mounting hole in a non-concentric manner and positioned in the first annular groove of the first interlocking member. The pivot shaft set comprises a first pivot shaft and a second pivot shaft. The first pivot shaft comprises a first mating connection portion and a first mounting portion respectively axially located at two opposite ends thereof. The second pivot shaft comprises a second mating connection portion and a second mounting portion respectively axially located at two opposite ends thereof. The first mating connection portion is inserted through the second through hole of the first interlocking member and the first mounting hole of the first transmission member for enabling the first transmission member to be rotated with the first pivot shaft. The second mating connection portion is inserted through the first through hole of the first interlocking member and the second mounting hole of the second transmission member for enabling the second transmission member to be rotated with the second pivot shaft.

Thus, when biasing the first pivot shaft, the first transmission member is driven by the first pivot shaft to rotate the first interlocking member and the second interlocking member, causing the first interlocking member and the second interlocking member to displace relative to each other and also causing the second pivot shaft and the first pivot shaft to be synchronously rotated in reversed directions.

BRIEF DESCRIPTION OF THE DRAWINGS

FIG. 2 is an exploded view, partially in sectional elevation, of the biaxial synchronization dual-shaft hinge in accordance with the present invention.

FIG. 3 is a front view of the first transmission member.

FIG. 4 is a side view of the first transmission member.

FIG. 5 is a rear side view of the first transmission member.

FIG. 6 is a front view of the second transmission member.

FIG. 7 is a side view of the second transmission member.

FIG. 8 is a rear side view of the second transmission member.

DETAILED DESCRIPTION OF THE PREFERRED EMBODIMENT

Figure 1:
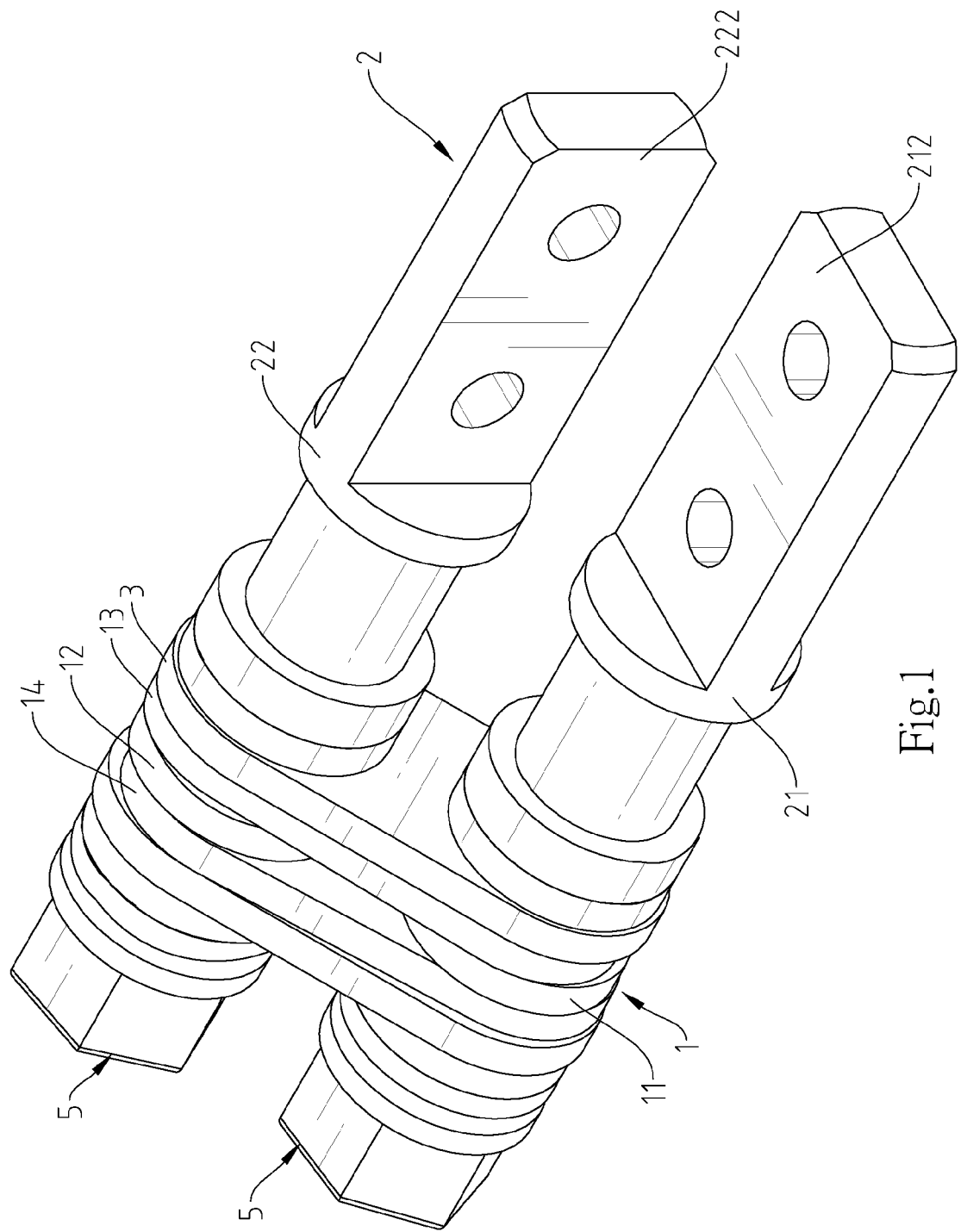
FIG. 1 is an elevational view of a biaxial synchronization dual-shaft hinge in accordance with the present invention.
Figure 9:
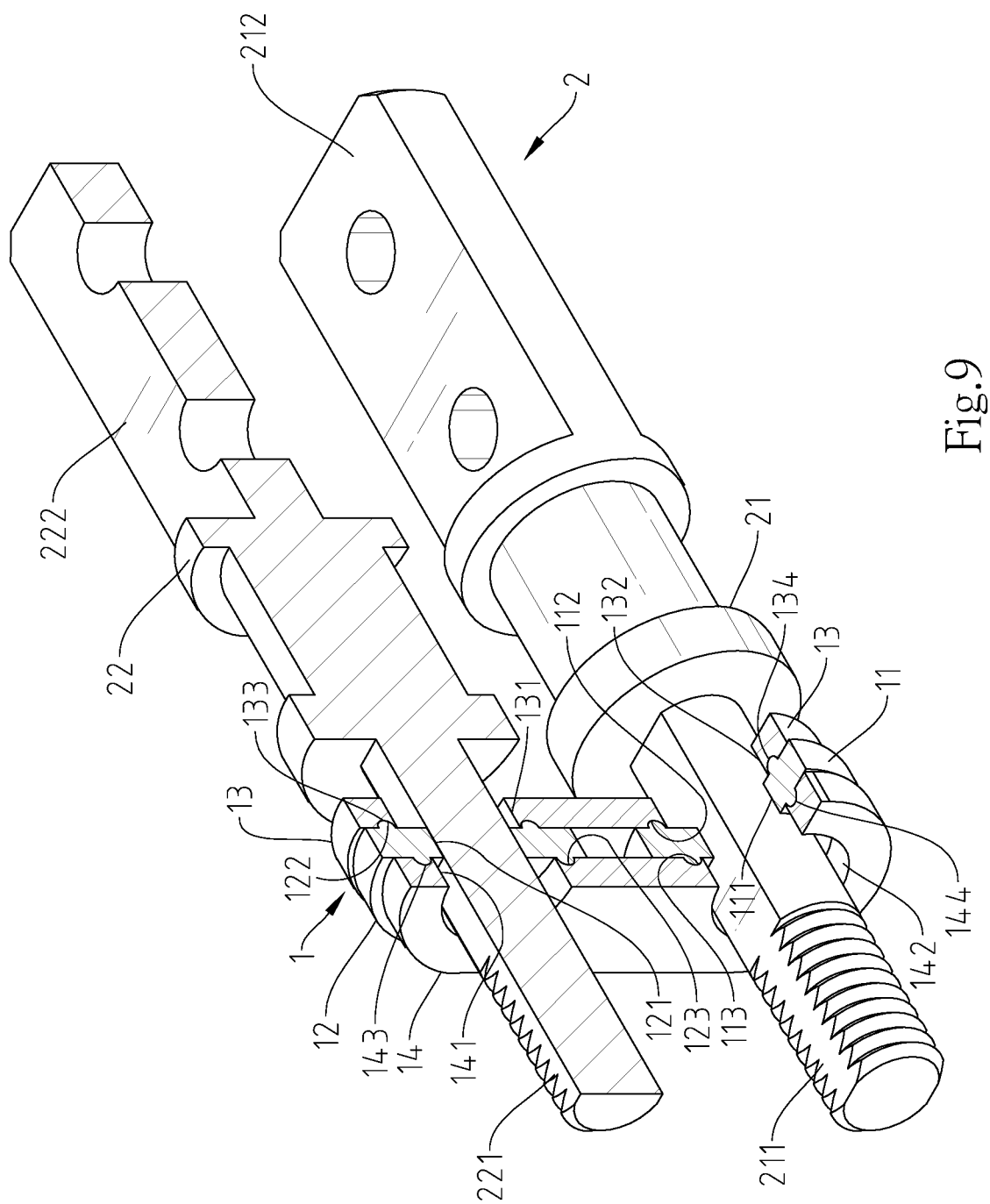
FIG. 9 is a sectional elevational view of the biaxial synchronization dual-shaft hinge in accordance with the present invention (I).
Figure 11:
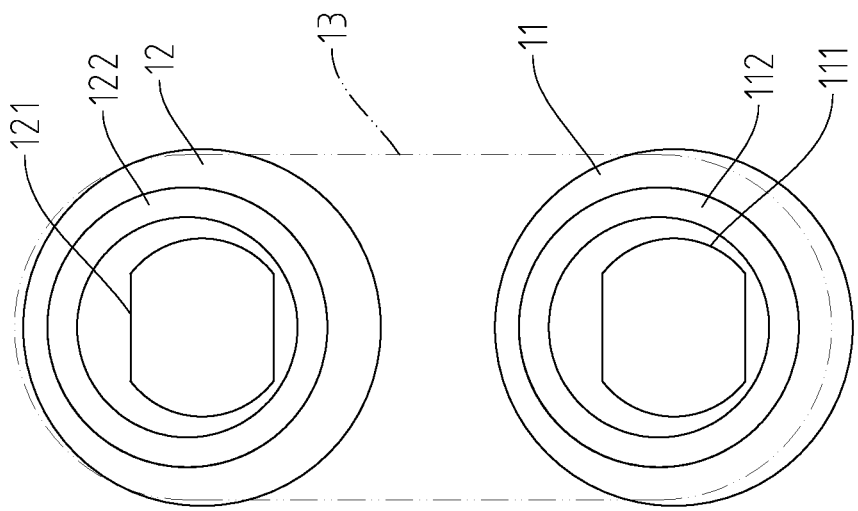
FIG. 11 is a schematic drawing of the present invention, illustrating an offset status of the transmission device set (II).
Figure 10:
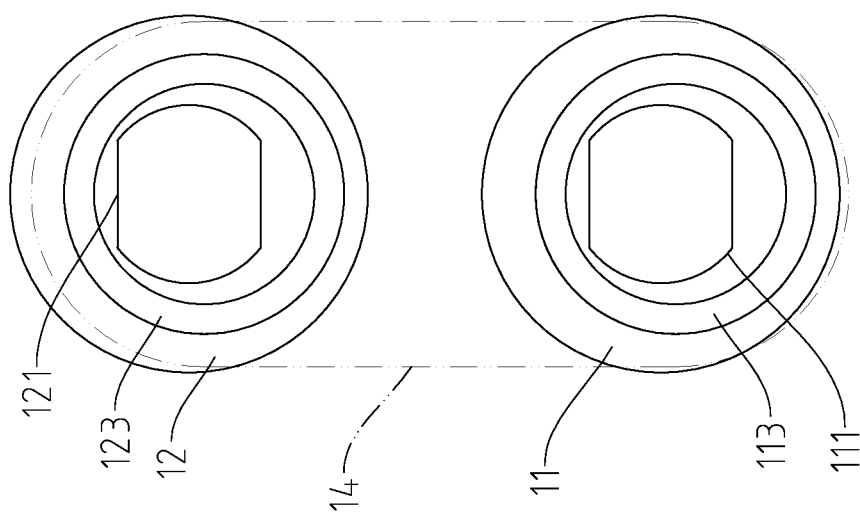
FIG. 10 is a schematic drawing of the present invention, illustrating an offset status of the transmission device set (I).
Figure 12:
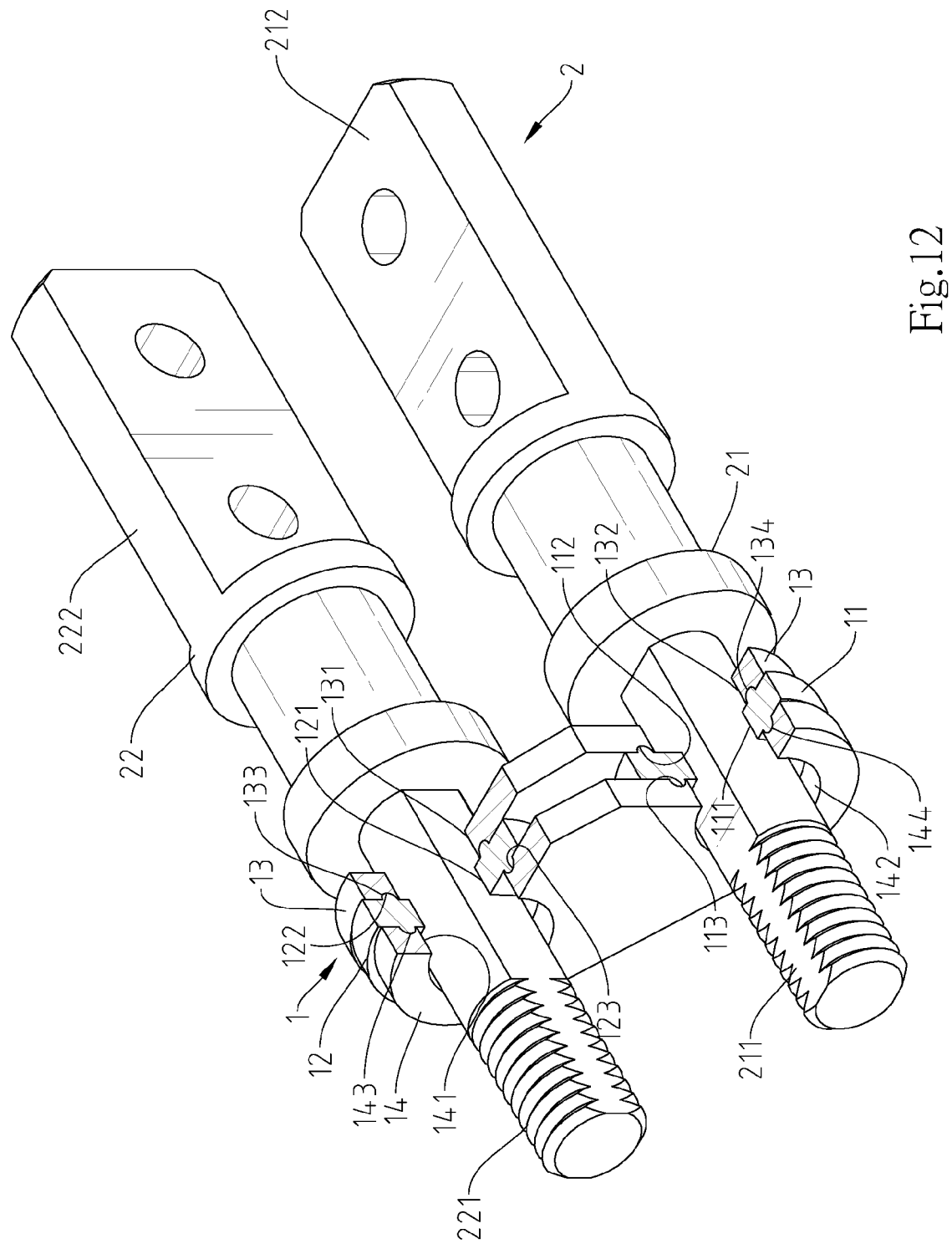
FIG. 12 is a sectional elevational view of the present invention, illustrating the first pivot shaft and the second pivot shaft rotated reversely.
Figure 14:
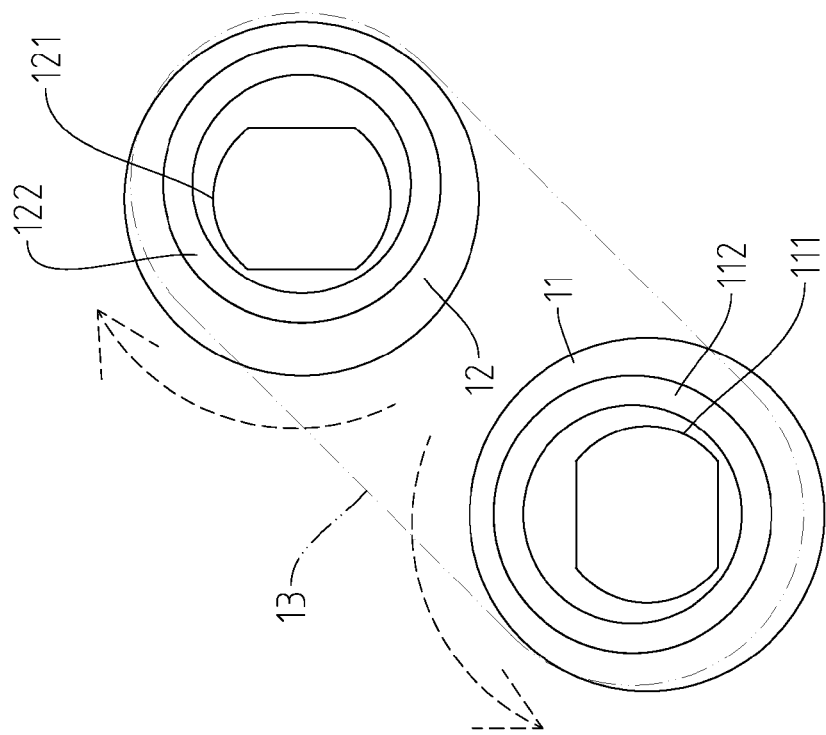
FIG. 14 is a schematic drawing of the present invention, illustrating an offset status of the transmission device set (IV).
Figure 13:
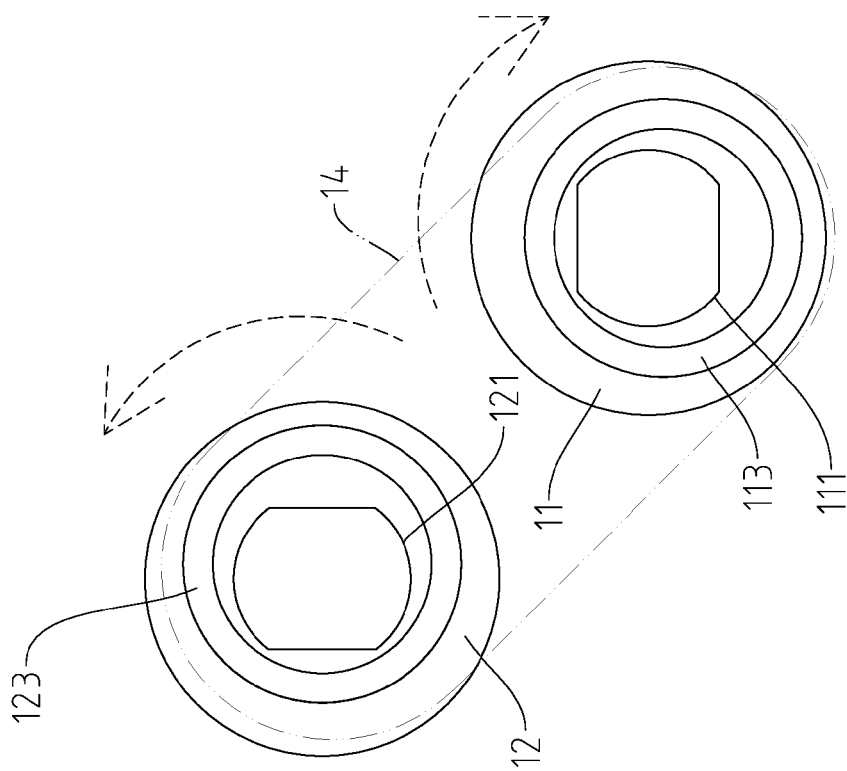
FIG. 13 is a schematic drawing of the present invention, illustrating an offset status of the transmission device set (III).
Figure 15:
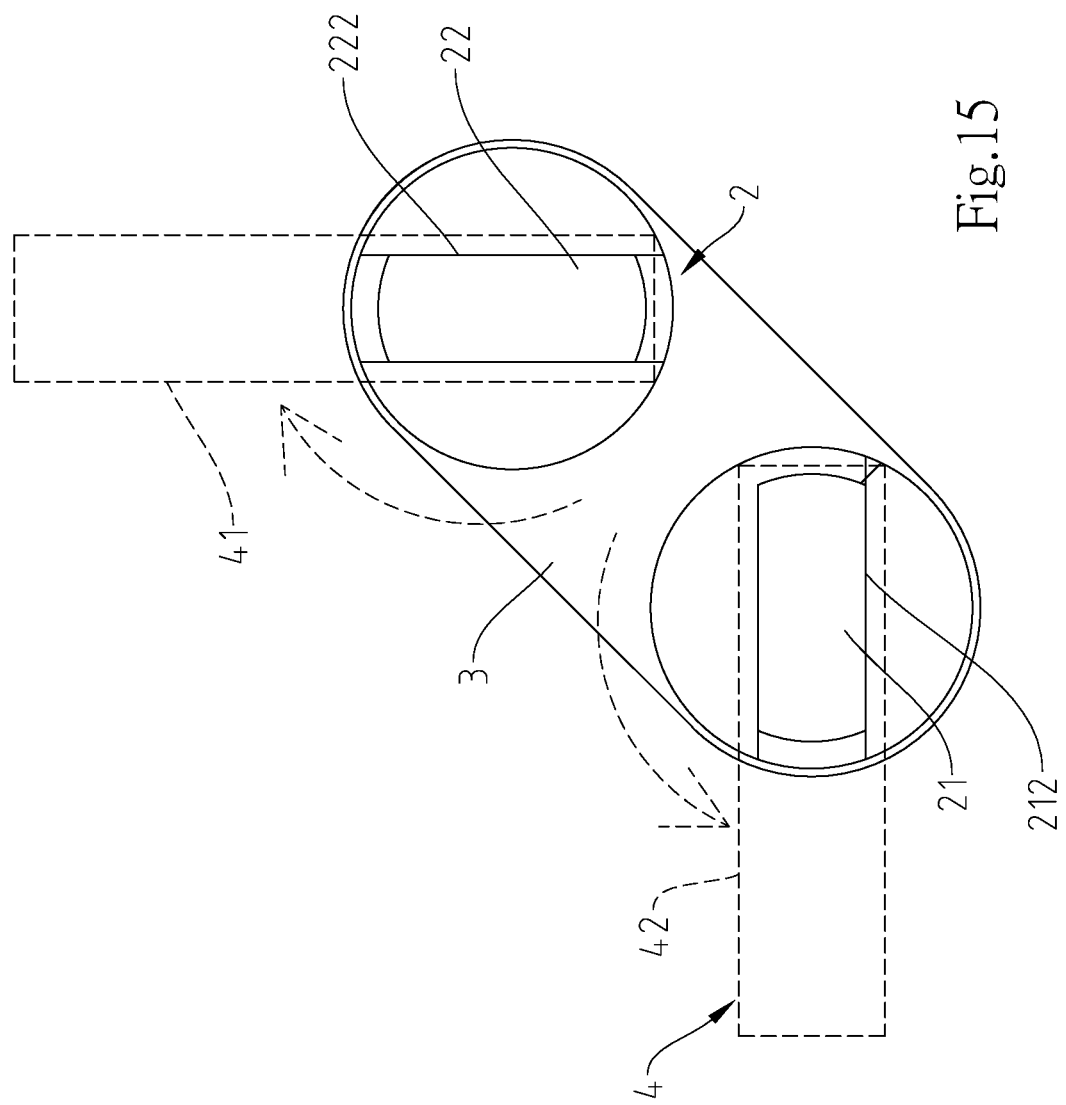
FIG. 15 is a schematic side view of the present invention, illustrating the first pivot shaft and the second pivot shaft respectively biased with the bottom base member and top cover member of the dual-leaf mobile electronic device in reversed directions.
Figure 16:
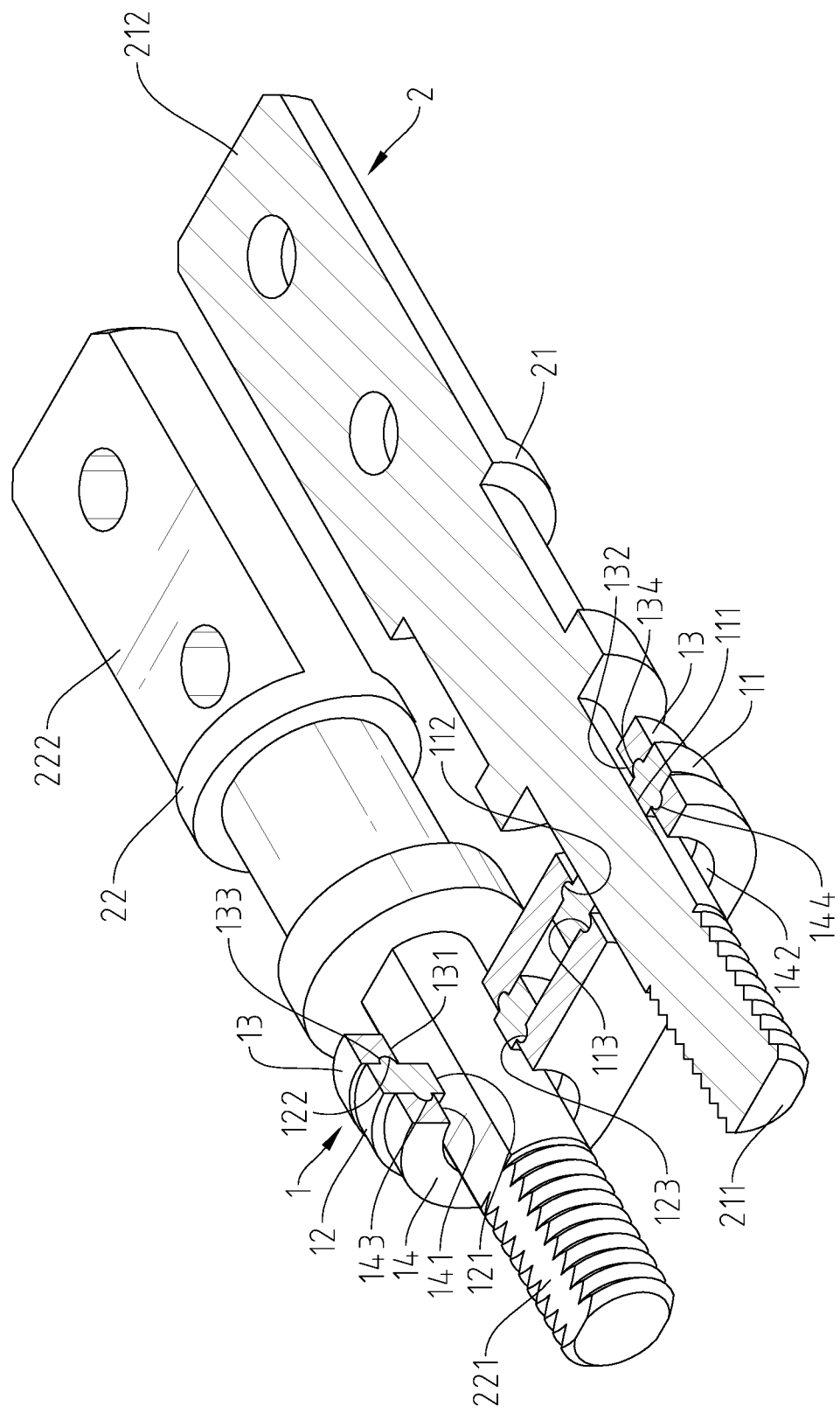
FIG. 16 is a sectional elevational view of the biaxial synchronization dual-shaft hinge in accordance with the present invention (II).

Referring to FIGS. 1-8 and FIG. 17, a biaxial synchronization dual-shaft hinge in accordance with the present invention is shown. The biaxial synchronization dual-shaft hinge comprises a transmission device set 1 and a pivot shaft set 2.

The transmission device set 1 comprises a first transmission member 11, a second transmission member 12, a first interlocking member 13, and a second interlocking member 14. The first interlocking member 13 comprises a first through hole 131 and a second through hole 132 provided through opposing front and back walls thereof, a first annular groove 133 located on the front wall and concentrically disposed around the first through hole 131, and a second annular groove 134 located on the front wall and concentrically disposed around the second through hole 132. The second interlocking member 14 comprises a third through hole 141 and a fourth through hole 142 provided through opposing front and back walls thereof, a third annular groove 143 located on the back wall and concentrically disposed around the third through hole 141, and a fourth annular groove 144 located on the back wall and concentrically disposed around the fourth through hole 142. The first transmission member 11 comprises a first mounting hole 111 provided through opposing front and back walls thereof, a first annular rib 112 located on the back wall and disposed around the first mounting hole 111 in a non-concentric manner and positioned in the second annular groove 134 of the first interlocking member 13, and a second annular rib 113 located on the front wall and disposed around the first mounting hole 111 in a non-concentric manner and positioned in the fourth annular groove 144 second interlocking member 14. The second transmission member 12 comprises a second mounting hole 121 provided through opposing front and back walls thereof, a third annular rib 122 located on the back wall and disposed around the second mounting hole 121 in a non-concentric manner and positioned in the first annular groove 133 of the first interlocking member 13, and a fourth annular rib 123 located on the front wall and disposed around the second mounting hole 121 in a non-concentric manner and positioned in the third annular groove 143.

The pivot shaft set 2 comprises a first pivot shaft 21 and a second pivot shaft 22. The first pivot shaft 21 comprises a first mating connection portion 211 axially located at one end thereof, and a first mounting portion 212 axially located at an opposite end thereof. The second pivot shaft 22 comprises a second mating connection portion 221 axially located at one end thereof, and a second mounting portion 222 axially located at an opposite end thereof. Further, the first mating connection portion 211 is inserted through the second through hole 132 of the first interlocking member 13, the first mounting hole 111 of the first transmission member 11 and the fourth through hole 142 of the second interlocking member 14. The second mating connection portion 221 is inserted through the first through hole 131 of the first interlocking member 13, the second mounting hole 121 of the second transmission member 12 and the third through hole 141 of the second interlocking member 14. Further, two torque adjustment members 5 are respectively threaded onto the distal end of the first pivot shaft 21 and the distal end of the second pivot shaft 22 for adjusting the torque.

Further, two locating plates 3 are respectively attached to the transmission device set 1 at two opposite sides. Each locating plate 3 comprises a first locating hole 31 and a second locating hole 32. The first locating hole 31 and the second locating hole 32 are respectively attached onto the second mating connection portion 221 of the second pivot shaft 22 of the pivot shaft set 2 and the first mating connection portion 211 of the first pivot shaft 21 of the pivot shaft set 2.

Referring to FIGS. 9-16, when using the biaxial synchronization dual-shaft hinge in a dual-leaf mobile electronic device 4, affix the mounting portion 212 of the first pivot shaft 21 of the pivot shaft set 2 and the second mounting portion 222 of the second pivot shaft 22 of the pivot shaft set 2 to the bottom base member 42 and top cover member 41 of the dual-leaf mobile electronic device 4 respectively. When the user opens the top cover member 41 from the bottom base member 42, the second pivot shaft 22 is driven to rotate the second transmission member 12, causing the third annular rib 122 and fourth annular rib 123 of the second transmission member 12 to move the first annular groove 133 of the first interlocking member 13 and the third annular groove 143 of the second interlocking member 14 respectively. Due to that the common axis of the third annular rib 122 and fourth annular rib 123 is located off the center of the second transmission member 12, the first interlocking member 13 and the second interlocking member 14 are displaced relative to each other at this time, and, the second annular groove 134 of the first interlocking member 13 and the fourth annular groove 144 of the second interlocking member 14 are forced to move the first annular rib 112 and second annular rib 113 of the first transmission member 11 respectively. Due to that the common axis of the first annular rib 112 and second annular rib 113 of the first transmission member 11 is located off the center of the first transmission member 11, the first transmission member 11 is driven to rotate the first pivot shaft 21 at this time, moving the top cover member 41 into a coplanar state relative to the bottom base member 42, and causing the first transmission member 11 and the second transmission member 12 can be rotated in reversed directions.

Referring to FIG. 2 again, subject to the design that the first mounting hole 111 and the second mounting hole 121 are non-circular holes and the design that the cross section of the first mating connection portion 211 of the pivot shaft set 2 and the cross section of the second mating connection portion 221 of the pivot shaft set 2 respectively tightly fit the non-circular inner diameter of the first mounting hole 111 the non-circular inner diameter of the second mounting hole 121, the first pivot shaft 21 and the second pivot shaft 22 can be driven to rotate the first transmission member 11 and the second transmission member 12 respectively and smoothly.

Figure 17:
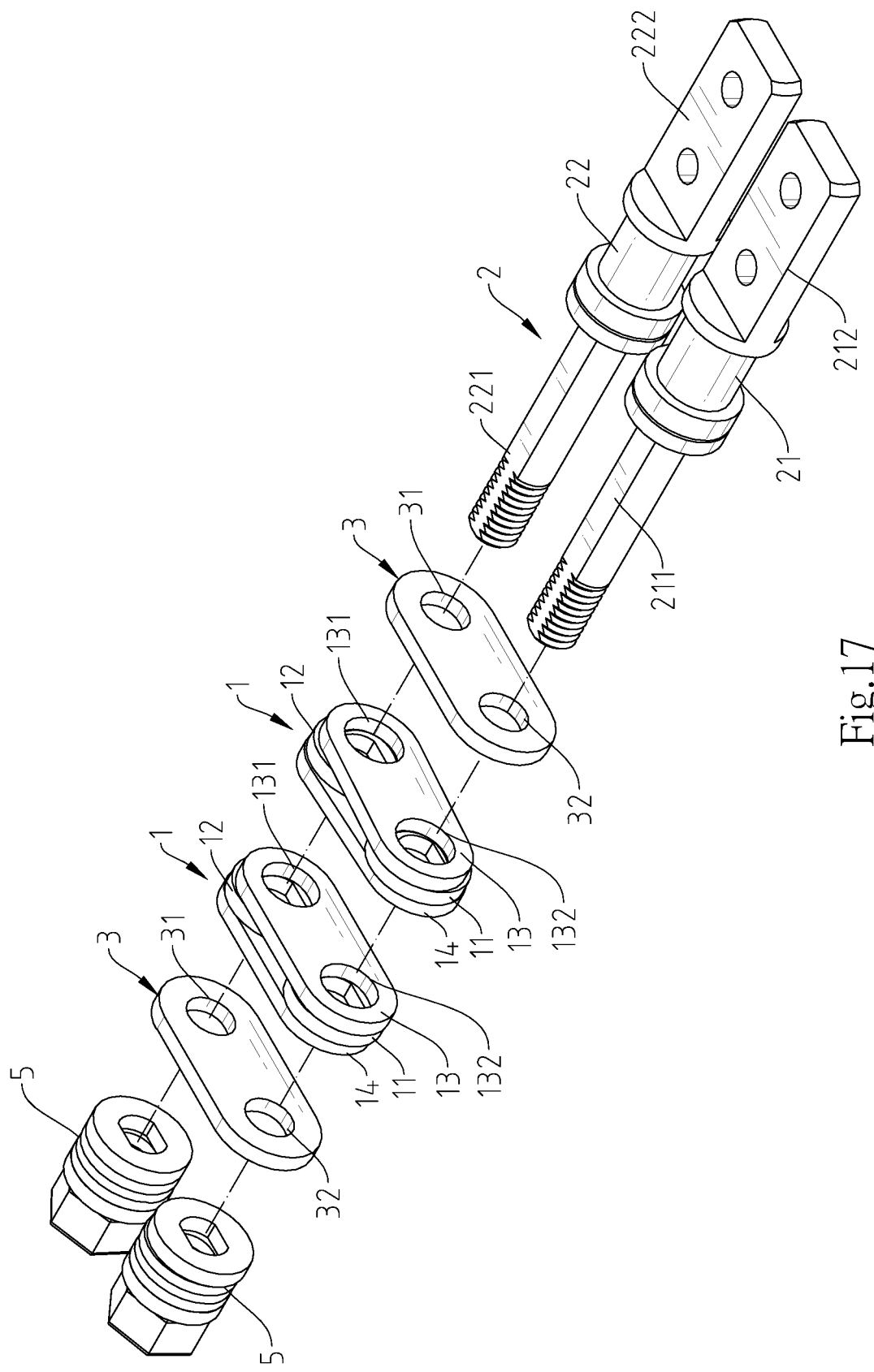
FIG. 17 is an exploded view of an alternate form of the biaxial synchronization dual-shaft hinge in accordance with the present invention.

Referring to FIG. 17, an alternate form of the biaxial synchronization dual-shaft hinge is shown. According to this alternate form, two transmission device sets 1 are mounted on the pivot shaft set 2 in a parallel manner between the two locating plates 3.

What is claimed is:
1. A biaxial synchronization dual-shaft hinge, comprising:
   a transmission device set comprising a first transmission member, a second transmission member and a first interlocking member, said first interlocking member comprising a first through hole and a second through hole provided through opposing front and back walls thereof, a first annular groove located on the front wall and concentrically disposed around said first through hole and a second annular groove located on the front wall and concentrically disposed around said second through hole, said first transmission member comprising a first mounting hole provided through opposing front and back walls thereof, a first annular rib loated on the back wall and disposed around said first mounting hole in a non-concentric manner and positioned in said second annular groove of said first interlocking member, said second transmission member comprising a second mounting hole provided through opposing front and back walls thereof, a third annular rib loated on the back wall and disposed around said second mounting hole in a non-concentric manner and positioned in said first annular groove of said first interlocking member; and a pivot shaft set comprising a first pivot shaft and a second pivot shaft, said first pivot shaft comprising a first mating connection portion and a first mounting portion respectively axially located at two opposite ends thereof, said second pivot shaft comprising a second mating connection portion and a second mounting portion respectively axially located at two opposite ends thereof, said first mating connection portion being inserted through said second through hole of said first interlocking member and said first mounting hole of said first transmission member for enabling said first transmission member to be rotated with said first pivot shaft, said second mating connection portion being inserted through said first through hole of said first interlocking member and said second mounting hole of said second transmission member for enabling said second transmission member to be rotated with said second pivot shaft.

2. The biaxial synchronization dual-shaft hinge as claimed in claim 1, wherein said transmission device set further comprises a second interlocking member, said second interlocking member comprising a third through hole and a fourth through hole provided through opposing front and back walls thereof and respectively coupled to said second mating connection portion of said second pivot shaft and said first mating connection portion of said first pivot shaft, a third annular groove located on the back wall and concentrically disposed around said third through hole, and a fourth annular groove located on the back wall and concentrically disposed around said fourth through hole; said first transmission member further comprises a second annular rib loated on the front wall thereof and disposed around said first mounting hole in a non-concentric manner and positioned in said fourth annular groove; said second transmission member further comprises a fourth annular rib loated on the front wall thereof and disposed around said second mounting hole in a non-concentric manner and positioned in said third annular groove.

3. The biaxial synchronization dual-shaft hinge as claimed in claim 1, further comprising two locating plates respectively attached to said transmission device set at two opposite sides, each said locating plate comprising a first locating hole and a second locating hole respectively coupled to said second mating connection portion of said second pivot shaft and said first mating connection portion of said first pivot shaft.

* * * * *